United States Patent
Li

(12) 
(10) Patent No.: US 7,300,822 B2
(45) Date of Patent: Nov. 27, 2007

(54) LOW WARPAGE FLIP CHIP PACKAGE SOLUTION-CHANNEL HEAT SPREADER

(75) Inventor: Yuan Li, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/118,630

(22) Filed: Apr. 28, 2005

(65) Prior Publication Data

US 2005/0250252 A1    Nov. 10, 2005

Related U.S. Application Data

(62) Division of application No. 10/616,858, filed on Jul. 9, 2003, now Pat. No. 6,888,238.

(51) Int. Cl.
*H01L 21/00* (2006.01)
(52) U.S. Cl. ........................ 438/122; 257/706
(58) Field of Classification Search ........ 257/704–706, 257/678–690; 438/118–122
See application file for complete search history.

(56) References Cited

U.S. PATENT DOCUMENTS 6,118,177 A * 9/2000 Lischner et al. ............ 257/706
2004/0070069 A1* 4/2004 Subramanian ............... 257/704

OTHER PUBLICATIONS

AMD, Aug. 21, 2002, Anantech.*

* cited by examiner

*Primary Examiner*—Nathan W. Ha
(74) *Attorney, Agent, or Firm*—Morgan, Lewis & Bockius LLP

(57) ABSTRACT

A semiconductor package includes a chip carrier to receive a semiconductor with a dimension generally greater than 22 mm. The chip carrier has a first coefficient of thermal expansion that is larger than the coefficient of thermal expansion of the semiconductor. A heat spreader having parallel channels on opposite sides is attached to the chip carrier along the channels. The heat spreader has a second coefficient of thermal expansion that is smaller than or equal to the coefficient of thermal expansion of the chip carrier. The interplay between the heat spreader and the chip carrier can effectively reduce package warpage and maintain coplanarity within the specification.

6 Claims, 5 Drawing Sheets

LOW WARPAGE FLIP CHIP PACKAGE SOLUTION-CHANNEL HEAT SPREADER

This application is a divisional of application Ser. No. 10/616,858, filed Jul. 9, 2003, that issued as U.S. Pat. No. 6,888,238, which is incorporated herein in its entirety.

BACKGROUND OF THE INVENTION

This invention relates generally to the packaging of semiconductor devices. More particularly, this invention relates to a large semiconductor device package that minimizes the impact of different coefficients of thermal expansion (CTE) associated with the environment in which the package exists. The invention further relates to a specific heat spreader design and installation technique employed for reducing package warpage due to internal thermal stress caused, for example, by differences in coefficients of thermal expansion between different material layers.

DESCRIPTION OF THE RELATED ART

One important characteristic of microelectronic technology is that integrated circuit geometry becomes smaller and smaller and circuitry density gets higher and higher, resulting in more powerful performance and more complex functionality per chip. This dramatic performance and functionality improvement requires so many more input/output (I/O) connections between a chip and a printed circuit board (PCB) that many of today's chips have hundreds, or even thousands, of pads serving this interconnection purpose. Even though the chip size keeps growing, the space left for each pad on the chip keeps shrinking. The shrinkage of the chip pad area has reached a degree that exceeds the capability of traditional wire bond technology to make connections from the chip to the package.

Flip-chip (FC) technology has proved to be a more attractive approach to solving the pad area limitation problem. In this method, a pattern of solder bumps is formed on one side of a chip that carries the integrated circuits. The chip is flipped upside down, aligned with the same pattern of solder pads formed on a substrate, and the solder bumps are brought into contact with the solder pads. Upon heating, the solder in the bumps and pads flows together; and upon cooling, the solder will form mechanical and electrical joints that connect the chip to the substrate.

Substrates made of different materials have different advantages. Ceramic has been chosen for FC packages from the very beginning because of its ease of assembly and high-temperature performance. However, the high cost of ceramic substrates limits their application to high-end products such as a CPU. Due to its low cost, organic material is more commonly used in a wider spectrum of applications, such as communication and automotive products. For example, Bismaleimide Triazine (BT) is one of the most popular advanced laminates and is widely used in FC packages.

The connection between the chip and the substrate is usually formed in a high temperature environment, e.g., 220° C. Because of the CTE difference between the chip and the substrate, thermal-mechanical stress and strain exist when the environmental temperature changes. This problem is more prominent with organic substrates than with ceramic substrates. For instance, while the CTE of the chip, mainly silicon, is only about 3 PPM/° C., and the CTE of ceramic material is about the same, the CTE of the BT substrate could be as high as 17 PPM/° C. in the plane of the substrate.

FIG. 1 is a schematic description of the thermomechanical deformation experienced by an organic substrate at different stages in an IC packaging process. As shown in view 110 of FIG. 1, substrate 112 contracts more than a chip 114 and bends itself into a convex shape after cooling to room temperature, following formation of solder joints 116 connecting chip 114 to substrate 112 at a high temperature such as 220° C. This contraction difference produces thermal stress and strain concentration on the solder joints between the chip and the substrate, potentially causing early fatigue failure of the system.

One approach to solve this stress and strain concentration problem is referred to as the "under-fill" operation, wherein a special liquid epoxy is used to fill completely the open space between the chip and the substrate. View 120 in FIG. 1 shows the flip-chip bonded device from view 110 after it has been re-heated to a temperature of 70-100° C. to reduce the thermal strain and then injected with under-fill material 118 in the space between the chip and the substrate. Upon curing, the resulting encapsulation provides appropriate thermal stress relief by spreading the concentrated stress and strain from the deformed solder joints to the under-fill material.

Besides stress and strain concentration, the other CTE-related issue is package warpage, wherein the bottom surface of the substrate contracts more freely than the top surface due to solder joint restraints from the chip, resulting in the substrate bowing into a convex shape. This problem remains substantially unsolved after under-fill curing, as shown in view 130 in FIG. 1. The reason is that the under-fill material primarily deals with shear stress and strain concentration on the joints.

The degree of package warpage mainly depends on the size of the chip and the package. When the package size is less than 27 mm$^2$, the package warpage is a less critical problem. However, for large flip-chip packages wherein the chip size could be several hundred square millimeters, the package warpage could easily exceed 8 mils, the standard set by the Joint Electron Device Engineering Council (JEDEC). Excessive warpage of the package prevents the attachment of the substrate to the printed circuit board and is one of many factors causing low yields.

A heat spreader lid has been proved to be very effective in reducing package warpage in addition to dissipating the heat produced by the semiconductor device. The material chosen for making the heat spreader usually has high CTE that is similar to that of the organic material used for making the substrate. For example, copper has been frequently chosen for making the heat spreader because its CTE is also about 17 PPM/° C.

As shown in view 140 of FIG. 1, after attaching a heat spreader lid 119 to substrate 112, the substrate warpage has been substantially corrected so that the electronic package remains flat. The reason is that the heat spreader is attached to the substrate via adhesive material, such as epoxy, in a high temperature environment. As the environment cools down, the heat spreader contracts in a similar fashion as the substrate wherein the top surface of the heat spreader contracts more quickly than the bottom surface. In other words, the heat spreader tends to bend itself upwards, producing normal stress at the contact area between the heat spreader and the substrate to pull back the substrate from bending downwards. If the heat spreader parameter is selected appropriately, the moment produced by the normal stress between the heat spreader and the substrate can effectively balance the moment produced by the shear stress between the chip and the substrate, maintaining the flatness of the package.

Mechanically speaking, the effectiveness of the heat spreader in terms of reducing package warpage depends on the size of the contacting area between the heat spreader and the substrate. Larger contacting area means more normal stress and more moment exerted on the substrate. Therefore, the more space is left for mounting the heat spreader, the better anti-warpage effect it can achieve. FIGS. 2A, 2B, and 2C show a 4-side heat spreader 200 and how it works in suppressing package warpage. FIG. 2A is a top perspective view of heat spreader 200 with a lid 210. FIG. 2B is a bottom perspective view of heat spreader 200 with four contact edges 220. As shown in FIG. 2C, heat spreader 200 exerts normal stress on the substrate through the four edges to bend substrate 230 into a concave shape and therefore minimizes package warpage in every direction. When the chip size is relatively small and there is enough free space on the substrate for attaching the heat spreader lid, the 4-side heat spreader has been proved most effective in suppressing package warpage.

On the other hand, IC manufacturers continually try to increase the size of the chip to achieve more complex function on a single chip and meanwhile reduce the package size relative to the chip size to reduce the system's dimensions. This development trend implies that the die-to-package ratio is getting larger and larger. When the difference between the die size and the package size is smaller than 7 mm in one dimension, a flip-chip ball grid array (BGA) is defined as having an ultra large die-to-package ratio (ULDPR) FC BGA.

In a package like ULDPR FC BGA, there is not enough room left for attaching a 4-side heat spreader. Instead, a 4-corner post heat spreader has been used. FIGS. 3A, 3B, and 3C show a 4-corner heat spreader 300 and how it works in suppressing package warpage. FIG. 3A is a top perspective view of heat spreader 300 with a lid 310 and corner posts 320. FIG. 3B is a bottom perspective view of heat spreader 300 with lid 310 and four posts 320. Similar to the 4-side heat spreader, the 4-corner heat spreader 300 exerts normal stress on the four corner of substrate 330 to attenuate the package warpage, as shown in FIG. 3C. Since the anti-warpage effect is approximately proportional to the size of the contact area between the heat spreader and the substrate, the 4-corner heat spreader is less effective compared with the 4-side heat spreader and the result is less homogeneous since the stress concentrates on the four corners.

In view of the foregoing discussion, it is highly desirable to provide an improved technique for mounting a heat spreader that can leverage the remaining free space on the substrate to the maximum so as to minimize the impact of material mismatches in the coefficients of thermal expansion. A need also exists for a packaging strategy that allows a large chip to be reliably mounted to a substrate while maintaining the coplanarity of the substrate within the JEDEC specification. Moreover, a need exists for a method of packaging integrated circuits that can be reliably connected to a motherboard containing other electrical circuits.

SUMMARY OF THE INVENTION

The present invention relates to an improved packaging technique that can maintain the flatness of a package like ULDPR FC BGA. More specifically, a chip is usually rectangular and a substrate square in shape. Therefore, there is more free space on two opposite sides of the substrate than the other two. The present invention is a heat spreader having parallel channels on opposite sides that takes advantage of this shape difference and attaches to the two sides with more space so as to substantially reduce the package warpage caused by the CTE difference between the chip and the substrate.

BRIEF DESCRIPTION OF THE DRAWINGS

For a better understanding of the invention, reference should be made to the following detailed description taken in conjunction with the accompanying drawings, in which.

DETAILED DESCRIPTION OF THE INVENTION

In the prior art, a 4-side heat spreader has been proved very effective in suppressing package warpage only when the die-to-package ratio is relatively small and there is enough room on the substrate to attach the 4-side heat spreader. A 4-corner heat spreader is less effective in suppressing package warpage since the stress concentrates only on the four corners of the substrate. Since the die is usually in the shape of rectangle and the substrate in the shape of a square, there is more space on two opposite sides of the substrate than the other two sides.

Figure 1:
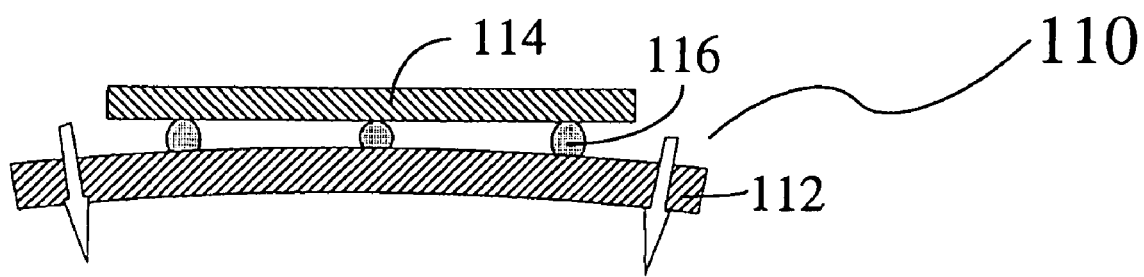
FIG. 1 is a schematic representation showing the interaction between a flip chip and a substrate at different stages in an IC packaging process due to the difference in coefficients of thermal expansion.
Figure 1:
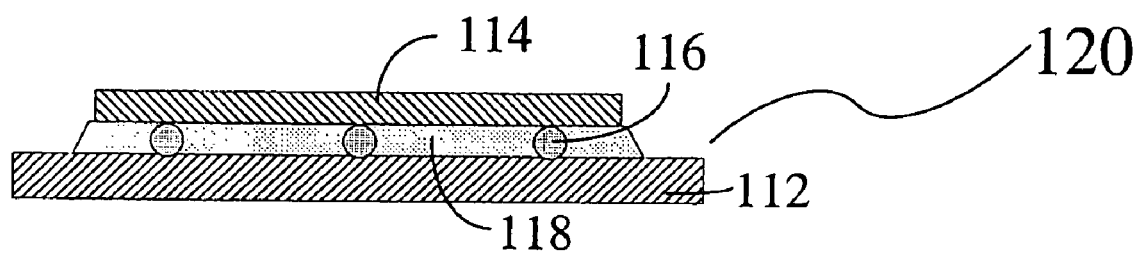
Figure 1:
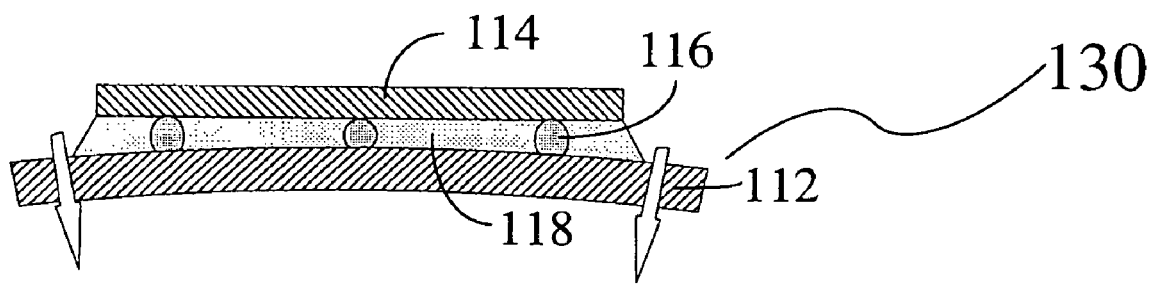
Figure 1:
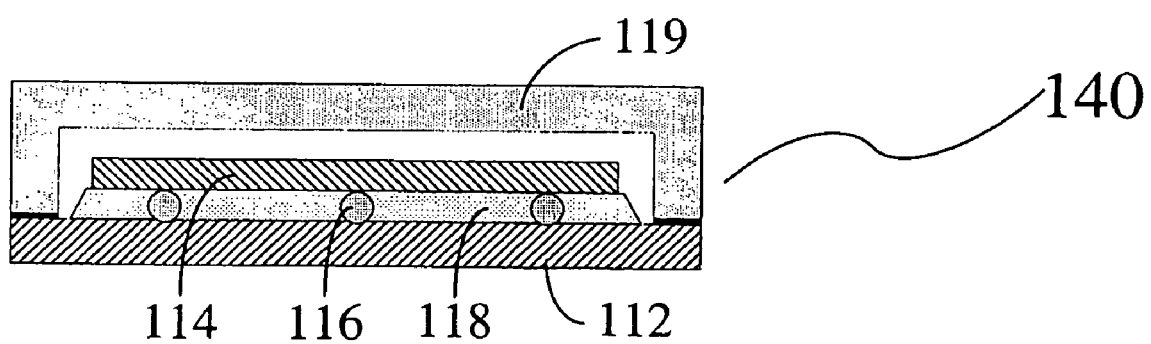
Figure 2A:
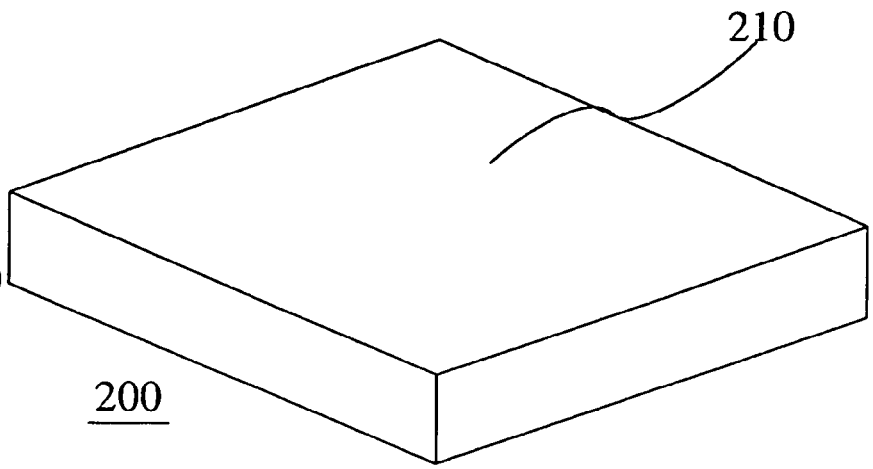
FIGS. 2A, 2B, and 2C are three perspective views of a prior art 4-side heat spreader.
Figure 2B:
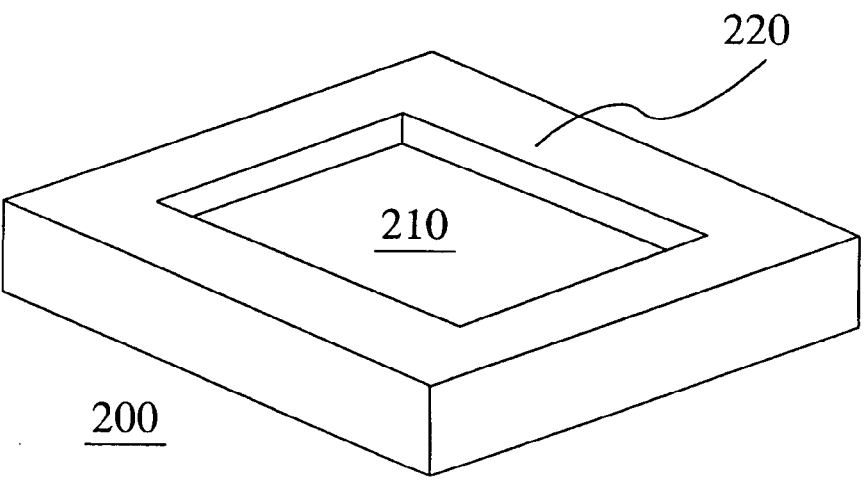
Figure 2C:
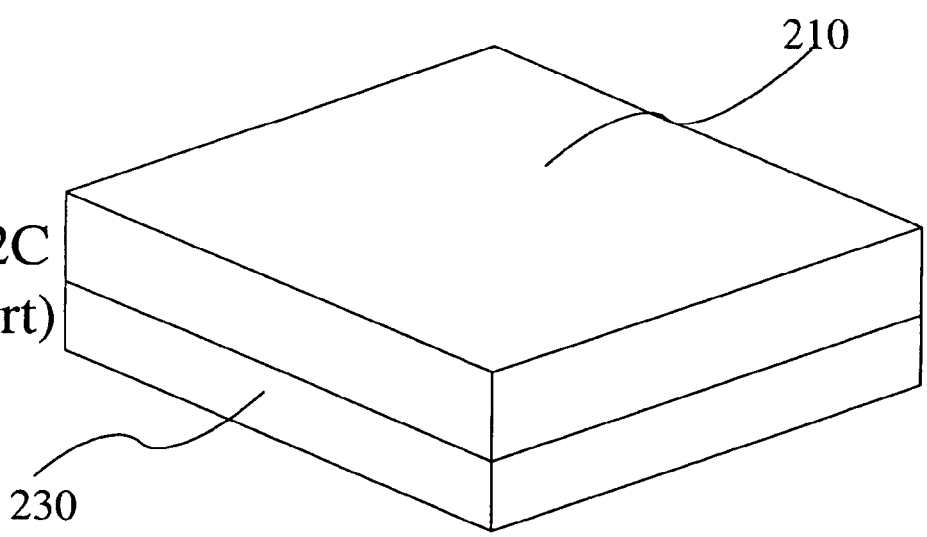
Figure 3A:
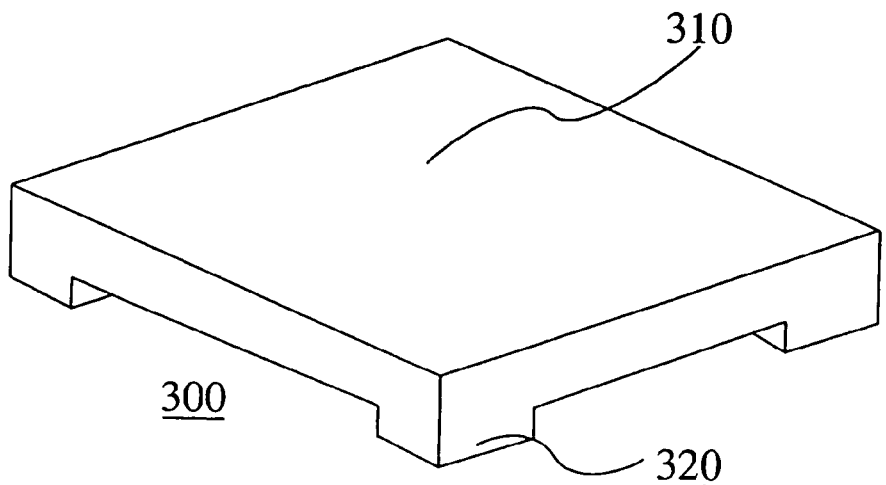
FIGS. 3A, 3B, and 3C are three perspective views of a prior art 4-corner heat spreader.
Figure 3B:
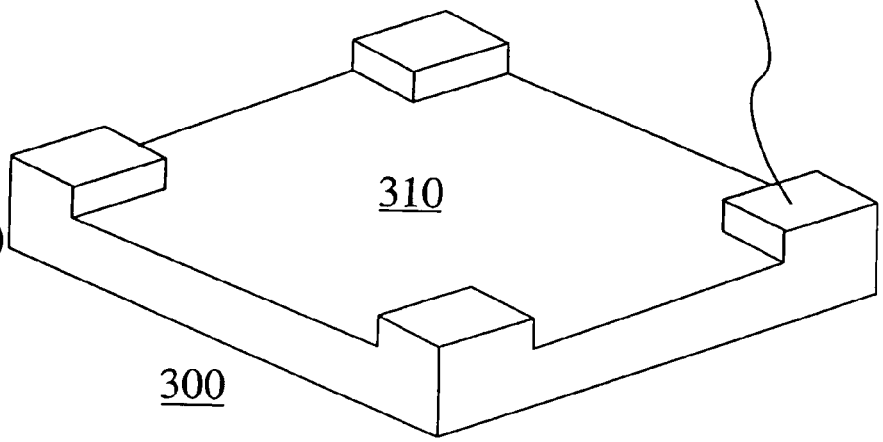
Figure 3C:
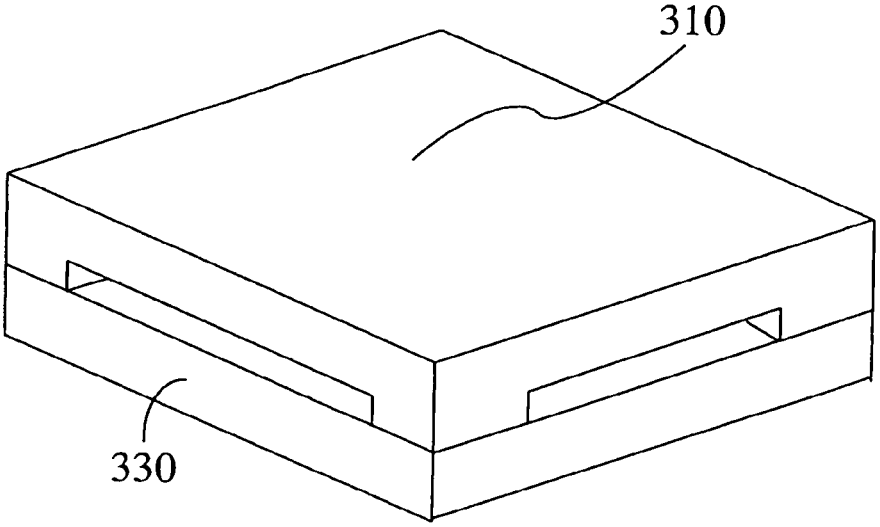
Figure 4A:
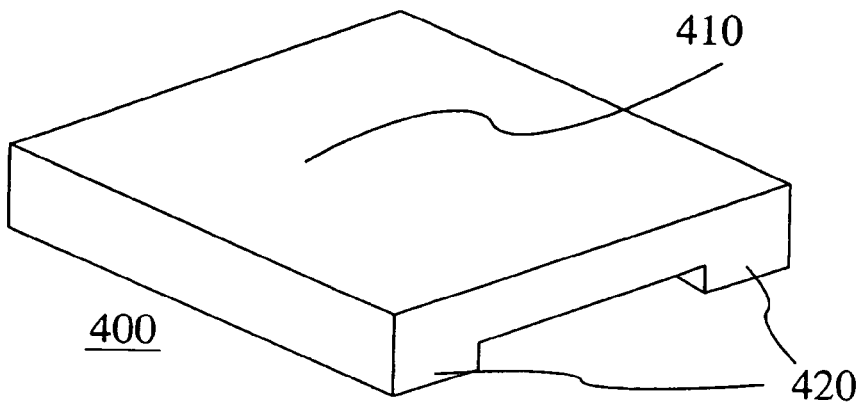
FIGS. 4A, 4B, and 4C are three perspective views of an illustrative channel heat spreader of the present invention.
Figure 4B:
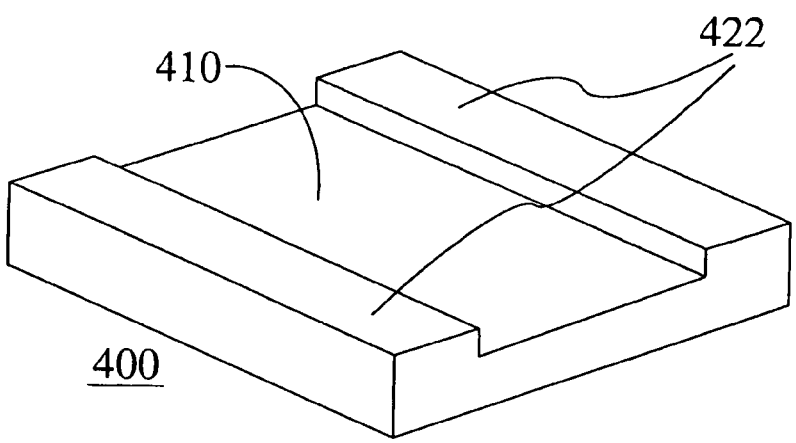
Figure 4C:
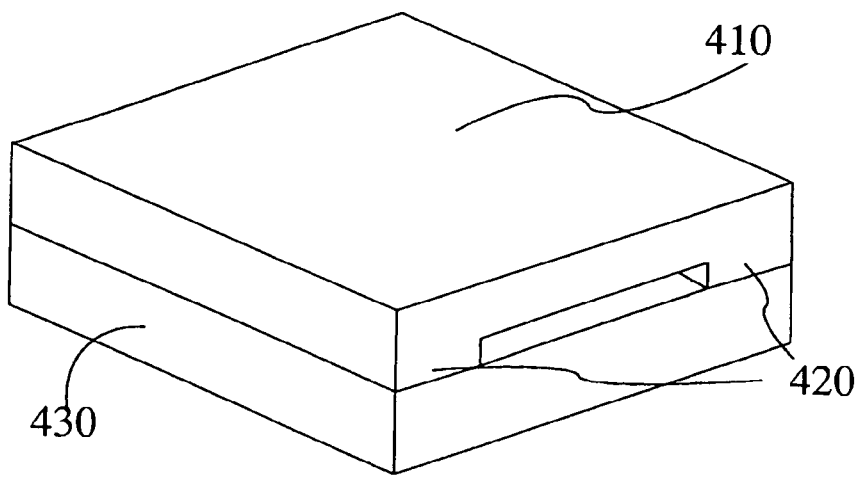

This invention is a channel heat spreader wherein there are two parallel channels on the heat spreader that are attached to the two sides on the substrate with more space. FIG. 4A is a top perspective view, depicting a channel heat spreader 400 comprising a lid 410 and two parallel channels 420. FIG. 4B is a bottom perspective view illustrating that each channel has a flat surface 422, which is substantially the same width as substrate 430. When heat spreader 400 is attached to substrate 430, as shown in FIG. 4C, the two channels 420 of heat spreader 400 contact two sides of the same surface of substrate 440 and heat spreader 400 exerts a significant amount of normal stress as well as the corresponding moment to pull back substrate 430 from bending into a convex shape. Unlike 4-corner heat spreader, the contact area in the present invention covers two complete sides. Therefore, there is much less stress concentration and much more homogeneous anti-warpage effect. Unlike 4-side heat spreader, the channel heat spreader leverages the free space on the substrate extensively and has been proved very effective when used with a package like ULDPR FC BGA.

Figure 5:
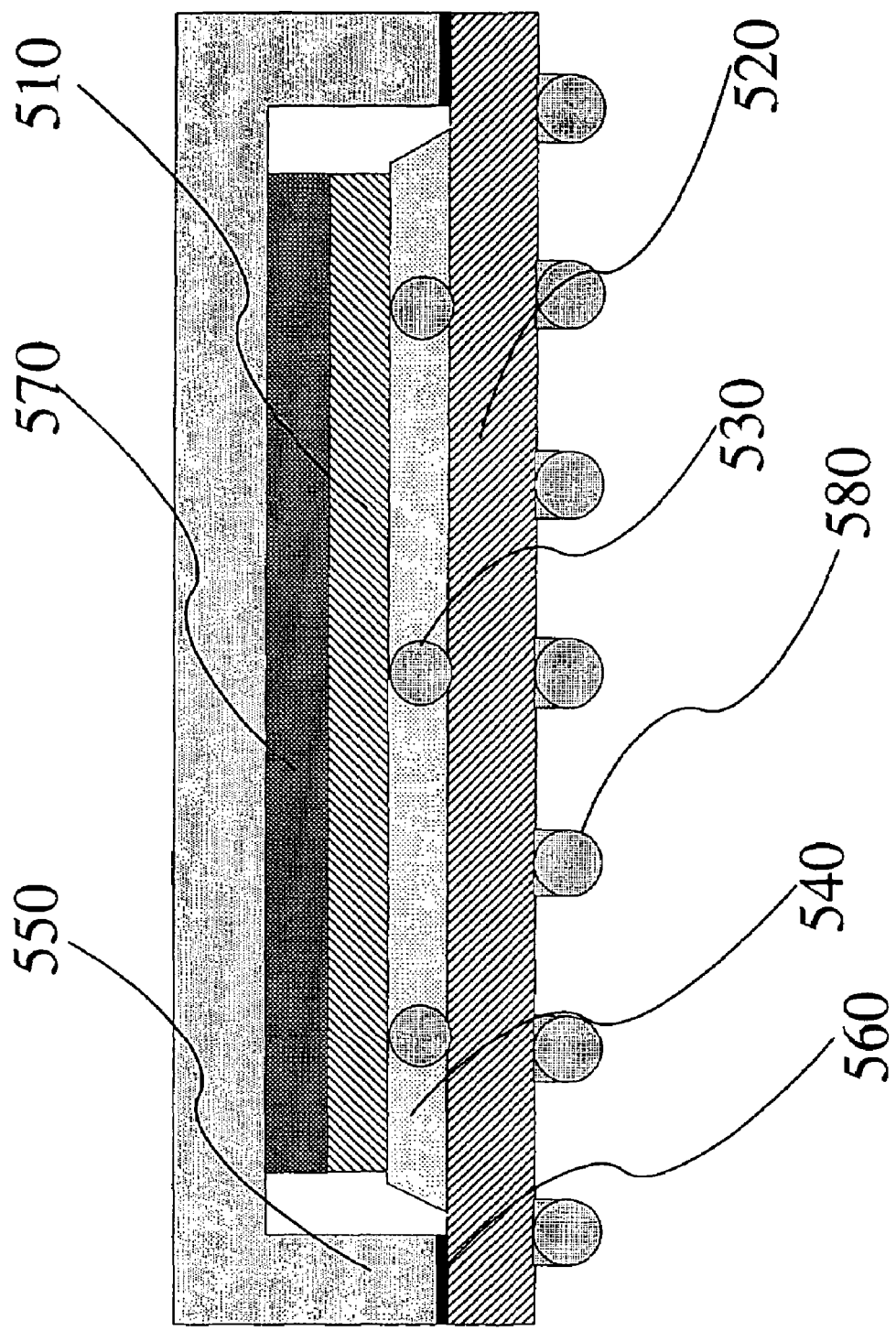
FIG. 5 illustrates a semiconductor package in which a channel heat spreader is attached to the substrate via adhesive material in accordance with an embodiment of the invention.

FIG. 5 illustrates a semiconductor package with a channel heat spreader mounted on a substrate in accordance with an embodiment of the invention.

The package houses a large semiconductor device 510 (i.e., a semiconductor with at least one dimension typically larger than 22 mm). The semiconductor device 510 is made of material with a CTE less than 3 PPM/° C. The semiconductor device is mounted on a substrate 520. The substrate 520 is made of organic material with a CTE between approximately 16 and 18 PPM/° C.

Solder bumps 530 interface the semiconductor device 510 to the organic substrate 520. There are internal traces inside the substrate 520 (not shown in the figure) connecting the top surface of the substrate to the bottom surface of the substrate. These traces, together with solder balls 580, provide electrical connection from the semiconductor device 510 to the printed circuit board (not shown in the figure), which also hosts other electronic circuits.

The semiconductor device 510 and the substrate 520 are assembled together in a high temperature environment of about 220° C. Due to the CTE difference, there is thermal stress between the semiconductor device 510 and the substrate 520 upon cooldown.

In order to reduce the impact of the CTE difference, under-fill resin 540 is injected into the empty space between the semiconductor device 510, the substrate 520, and the solder bumps 530. The under-fill resin 540 surrounding the solder bumps can significantly relieve the thermal stress concentration on the solder bumps 530 and improve the reliability and longevity of the solder bump connections between the semiconductor device 510 and the substrate 520.

The semiconductor device 510 is usually in the shape of a rectangle having two long edges and two short edges. In contrast, the substrate 520 is usually in a square shape having four edges of equal dimension. Therefore, when the semiconductor device 510 is positioned in the central region of the upper surface of substrate 520 with the two long edges of the device 510 parallel to two opposite edges of the substrate 520, there is more open space on the substrate along these two opposite edges than the other two opposite edges.

The channel heat spreader 550 is usually made of metal material, such as copper having CTE equal to 17 PPM/° C., and is engaged with the substrate in a similar high temperature environment of about 150° C. The two channels of a channel heat spreader are attached by adhesive 560, such as epoxy, to substrate 520 in the direction where there is more open space.

A thermal compound 570 (e.g., a thermal grease) is used between semiconductor device 510 and channel heat spreader 550. When the package cools down to room temperature, heat spreader 550 contracts more than semiconductor device 510. As a result, the two channels on heat spreader 550 exert normal stress as well as the corresponding moment on the substrate 520 to prevent it from bending into a convex shape.

In a preferred embodiment of the invention, the substrate is made of core material and build-up material. Core material is bismalesmide triazine (BT) and build-up material is Ajinomoto ABF. The solder bump is made of either 63Sn37Pb or 95Pb5Sn and its diameter is 100 um. The substrate thickness is about 1.3 mm in which the core occupies either 0.8 mm or 1.0 mm. The dimensions of channel heat spreader 550 are about 27×27 mm². The dimensions of the channels are about 27×2×0.6 mm³. The thickness of the heat spreader lid is about 0.5 mm. Thus, the thickness of the heat spreader as measured at the channels is about 1.1 mm. The average package warpage was reduced to 3.98 mils, in contrast with 7 mils average package warpage from a same-size 4-corner heat spreader, or a 43% improvement. The maximum package warpage was reduced to 5.28 mils, compared against 9.8 mils from a same-size 4-corner heat spreader, or 54% improvement.

The invention disclosed herein provides methods of package construction that allow for the packaging of a first part having low CTE characteristics assembled to a structure of a second part having high CTE characteristics and then a third part having similarly high CTE characteristics assembled to the second part. The construction package and techniques of the invention provide for mechanical stress alleviation and low warpage through a layered structure with different coefficients of thermal expansion.

The final package assembly can then be mounted to a motherboard or similar construction that has a CTE which closely matches the CTE of the second part. The methods disclosed herein may apply to chips of various sizes, including chips having a form factor that is large in comparison to the overall substrate size.

The foregoing description, for purposes of explanation, used specific nomenclature to provide a thorough understanding of the invention. However, it will be apparent to one skilled in the art that the specific details are not required in order to practice the invention. The embodiments were chosen and described in order to best explain the principles of the invention and its practical applications, to thereby enable others skilled in the art to best utilize the invention and various embodiments with various modifications as are suited to the particular use contemplated. Thus, the foregoing disclosure is not intended to be exhaustive or to limit the invention to the precise forms disclosed. Many modifications and variations are possible in view of the above teachings.

It is intended that the scope of the invention be defined by the following claims and their equivalents.

What is claimed is:

1. A method for packaging an electronic device, comprising:

mounting the electronic device on a first side of a substrate, the electronic device having two long edges and two short edges and each device edge being parallel to one of four edges of the substrate, wherein each of the two short device edges is substantially closer to its parallel substrate edge than each of the two long device edges is to its parallel substrate edge so that there is more space on the substrate between each of the two long device edges and its parallel substrate edge than between each of the two short device edges and its parallel substrate edge; and mounting a heat spreader on the first side of the substrate covering the electronic device, wherein the heat spreader has a lid and only two parallel sidewalls extending therefrom and each of the two parallel sidewalls is attached to the first side of the substrate in one of the two spaces on the substrate between the two long device edges and their parallel substrate edges.

2. The method of claim 1, wherein the device is substantially a rectangle that has two long edges and two short edges and the substrate is substantially a square that has four edges of equal dimension, and the device is mounted in the central region of the first surface of the substrate such that the two spaces on the substrate between the two long device edges and their parallel substrate edges are substantially equal to each other and the two spaces on the substrate between the two short device edges and their parallel substrate edges are substantially equal to each other.

3. The method of claim 1 wherein the heat spreader is attached to the substrate through an adhesive material in a high temperature environment.

4. The method of claim 3 wherein the adhesive material is epoxy, the high temperature environment is about 200° C., and the heat spreader is made of a material with a coefficient of thermal expansion similar to that of copper.

5. The method of claim 1 wherein the thickness of each channel is about 0.6 mm, the side width of the heat spreader is about 2 mm, and the length of the heat spreader is about the same as the length of the substrate.

6. The method of claim 1 wherein the difference between the electronic device and a package in which it is enclosed is less than 7 mm. in one dimension.

* * * * *